(12) United States Patent
Mori et al.

(10) Patent No.: US 6,700,642 B2
(45) Date of Patent: Mar. 2, 2004

(54) LASER EXPOSURE APPARATUS

(75) Inventors: Masaki Mori, Shiga (JP); Hiroyuki Nakagawa, Kyoto (JP)

(73) Assignee: Toray Engineering Company, Limited, Osaka (JP)

( * ) Notice: Subject to any disclaimer, the term of this patent is extended or adjusted under 35 U.S.C. 154(b) by 70 days.

(21) Appl. No.: 09/959,633

(22) PCT Filed: Mar. 12, 2001

(86) PCT No.: PCT/JP01/01906
§ 371 (c)(1),
(2), (4) Date: Nov. 1, 2001

(87) PCT Pub. No.: WO01/69661
PCT Pub. Date: Sep. 20, 2001

(65) Prior Publication Data
US 2002/0158964 A1 Oct. 31, 2002

(30) Foreign Application Priority Data
Mar. 16, 2000 (JP) .......................................... 2000-74709

(51) Int. Cl.$^7$ .......................... G03B 27/42; G06K 19/06
(52) U.S. Cl. .......................................... 355/53; 235/494
(58) Field of Search .............. 355/53; 235/62.01–62.11, 235/494

(56) References Cited

U.S. PATENT DOCUMENTS

| | | | | |
|---|---|---|---|---|
| 4,794,238 A | * | 12/1988 | Hampton | 235/462.32 |
| 4,810,867 A | * | 3/1989 | Speicher | 235/494 |
| 5,710,620 A | * | 1/1998 | Taniguchi | 355/53 |
| 6,051,845 A | * | 4/2000 | Uritsky | 250/559.3 |
| 6,179,207 B1 | * | 1/2001 | Bossen et al. | 235/462.01 |
| 6,310,680 B1 | * | 10/2001 | Taniguchi | 355/53 |

* cited by examiner

Primary Examiner—Russell Adams
Assistant Examiner—D. Ben Esplin
(74) Attorney, Agent, or Firm—Rader, Fishman & Grauer PLLC

(57) ABSTRACT

A laser exposure apparatus including a laser oscillator (1) for oscillating laser beam having a circular section, a beam expander (4) for enlarging the laser beam oscillated from the laser oscillator, a square mask (6) for shaping the laser beam having the circular section enlarged by the beam expander into a square section and an optical system for contracting the laser beam formed into the square section by the square mask. Even when a very small identification code is attached to a wafer, the identification code can be marked to improve reading recognizability of the identification code.

7 Claims, 3 Drawing Sheets

(a)

(b)

(a)

(b)

(a)

(b)

(a)

(b)

LASER EXPOSURE APPARATUS

TECHNICAL FIELD

The present invention relates to a laser exposure apparatus, more in details, to a laser exposure apparatus for exposing an identification code attached to a wafer for carrying out history control or quality control for respective process in semiconductor fabricating steps or the like.

BACKGROUND OF THE INVENTION

Conventionally, in fabricating steps of a liquid crystal panel, there has already been carried out history control or quality control for respective fabrication process by attaching an identification code to the liquid crystal panel. Two-dimensional codes or characters are used for the identification code and the two-dimensional codes or the characters are marked on a surface of the liquid crystal panel by exposing the surface to laser beam.

However, in the case of the liquid crystal panel, the liquid crystal panel per se is a comparatively large object and therefore, it is not necessary to reduce the identification code to be marked and the identification code does not become unreadable. However, in the case of a wafer dealt with in semiconductor fabricating steps, the wafer is a very small object and therefore, the identification code attached thereto is obliged to be very small. As a result, in reading the identification code, the identification code may become unreadable by a scanning type camera.

FIGS. 4A and 4B are explanatory views showing a situation when an identification code marked by a conventional laser exposure apparatus is read by a scanning type camera.

As shown by FIG. 4A, an identification code M' marked by a conventional laser exposure apparatus is formed by an aggregation of a number of circular dots d'. When the identification code M' comprising the aggregation of the circular dots d' is read by a scanning type camera, a number of scanning lines A through E are scanned to cross the identification code M' to thereby discriminate portions of the black circular dots d' from a white matrix portion.

However, as shown by FIG. 4B, although according to the scanning lines A and D searching vicinities of centers of the circular dots d', signal levels received thereby correctly catch the identification code M', according to the scanning lines B, C and E searching portions deviated from the centers of the circular dots d', as shown by broken lines, there appears noise n' caused by a clearance formed between the two contiguous circular dots d' in signal levels and there is a concern that the noise is erroneously recognized as if the white matrix were present.

Further, in the semiconductor fabricating steps, after marking the identification code on the wafer, a metal film may further be coated in later steps. When the metal film is provided in this way, as shown by FIG. 5A, black and white contrast of the circular dots d' is remarkably deteriorated and therefore, the scanning lines A through E must read to catch contours of the circular dots d' and signal levels thereof appear as shown by FIG. 5B. Also in this case, according to the signal levels provided from the scanning lines B. C and E, similar to the case of FIG. 4B, there appears the noise n' caused by the clearance formed between the two contiguous circular dots d' and therefore, the noise n' similarly causes the erroneous recognition.

The noise n or n' in FIG. 4 or FIG. 5 may be avoided by a filter processing or the like. However, by adding such a processing mechanism, there poses a problem that the cost is increased or a processing time period is taken.

DISCLOSURE OF THE IINVENTION

It is an object of the invention to provide a laser exposure apparatus in which even when a very small identification code is attached to a very small object such as a wafer, there is enabled marking for improving reading recognizability of the identification code.

A laser exposure apparatus of the invention achieving the above described object is characterized in comprising a laser oscillator for oscillating a laser beam having a circular section, a beam expander for enlarging the laser beam oscillated from the laser oscillator, a square mask for shaping the laser beam having the circular section enlarged by the beam expander into a square section and an optical system for contracting the laser beam formed into the square section by the square mask.

In this way, the laser beam having the circular section oscillated from the laser oscillator is shaped into the laser beam having the square section by the square mask and therefore, an identification code comprising an aggregation of dots exposed by the laser beam, is not formed with a clearance between contiguous ones of the dots as in the case of the conventional circular dots. Therefore, noise caused by the clearance is not caused in a signal searched by a scanning line of a scanning type camera and the identification code can be recognized correctly.

BEST MODE FOR CARRYING OUT THE INVENTION

Figure 1:
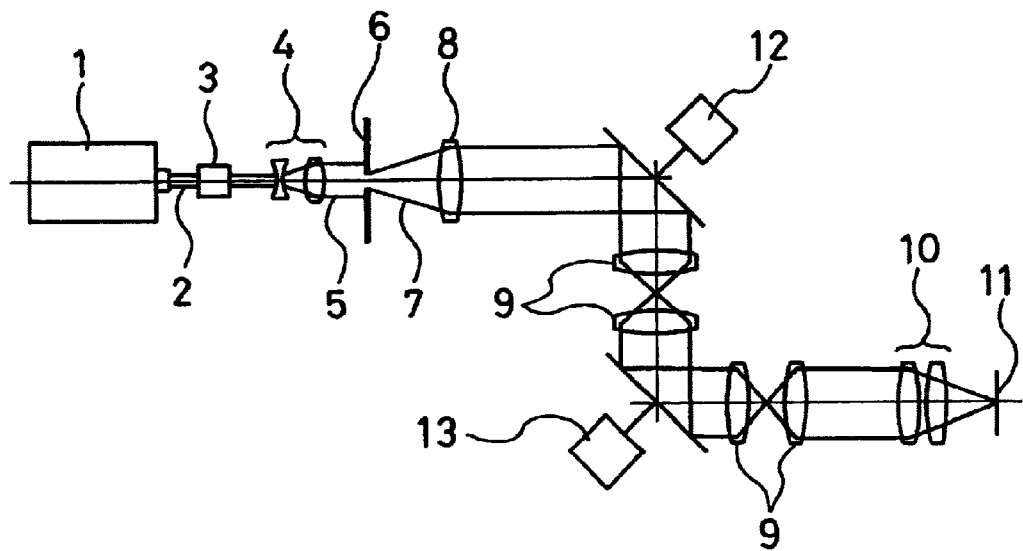
FIG. 1 is an outline view for exemplifying a laser exposure apparatus according to the invention.

In FIG. 1, numeral 1 designates a laser oscillator constituting a light source for oscillating and projecting laser beam 2 having a circular section. There is provided a shutter mechanism 3 at a beam projection port of the laser oscillator 1 and the laser beam 2 can be blocked by the shutter mechanism 3. The laser beam 2 which has passed through the shutter mechanism 2 is formed into laser beam 5 having a circular section, a beam sectional area of which is widened by a beam expander 4 or means for making a power distribution uniform such as a homogenizer.

The laser beam 5 is shaped into laser beam 7, in which only a central portion thereof having strong laser power is cut into a square section by a square mask 6. The laser beam 7 shaped into the square section passes through an optical system formed from successive focusing lens 8 to an object lens 10. According to the optical system, the laser beam 7 is firstly contracted into parallel beam by the focusing lens 8, the parallel beam is formed into a marking pattern by operation of scanners 12 and 13 and the marking pattern is exposed from the final object lens 10 onto a wafer 11 as the identification code while being relayed by relay lenses 9.

In the optical system, the scanners 12 and 13 are not necessarily indispensable but instead of providing the scanners, the wafer 11 may be operated to move in conformity with the marking pattern. Further, the optical system may be inserted with a mirror or a prism at a pertinent location as necessary to thereby bend the optical path. Further, in order to correct warping of image or an optical path length, after the scanners, fθ lens may be added, or a laser separate from the laser for the exposure light source may be put in the middle of the optical path for adjusting an optical axis or confirming an exposed state. Further, a camera or the like may be put therein for observation.

The shutter mechanism 3 may be a mechanical shutter or may be a modulator using an accousto-optic element. Further, instead of inserting the shutter mechanism, laser oscillation per se may be controlled to be ON or OFF.

A method of exposing an identification code on a wafer is carried out as follows by the laser exposure apparatus according to the invention, described above.

The laser beam 2 emitted from the laser oscillator 1 is substantially parallel beam normally comprising a circular section and the laser power is the strongest at a central portion thereof and is extremely weak at a peripheral portion thereof. The laser beam 2 is formed into the laser beam 5 having a wide sectional area to stay in the parallel beam by the beam expander 4. The laser beam 5 having the enlarged sectional area still stays to be in the circular shape and a state in which the laser power at the central portion is strong is maintained. With regard to the laser beam 5, only the central portion having the strong power is cut into a square section by the square mask 6 to thereby provide the strong laser beam 7 having the uniform power distribution.

The laser beam 7 having the square section cut by the square mask 6, is contracted into a square image having a predetermined size by the object lens 10 via the focusing lens 8 and the relay lenses 9 and the image is constituted on the surface of the wafer 11. The scanners 12 and 13 draw the identification code on the surface of the wafer 11 by operating the shutter mechanism 3 in synchronism therewith and distributing the square image in accordance with the pattern of the identification code. For example, when a square image cut into a square section having an aperture area of 1 mm square by the square mask 6, is contracted into one hundredth by the optical system from the focusing lens 8 to the object lens 10, the square image can be formed into a very small dot having 10 micrometers square and exposed onto the wafer 11.

Figure 2:
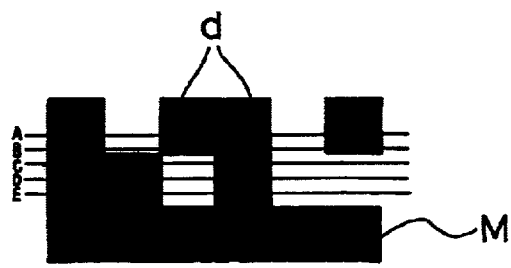
FIG. 2A is an explanatory view showing an identification code formed by the laser exposure apparatus according to the invention and a situation when the identification code is searched by a scanning type camera and FIG. 2B is an explanatory view showing signal levels provided by searching the identification code by the scanning type camera.
Figure 2:
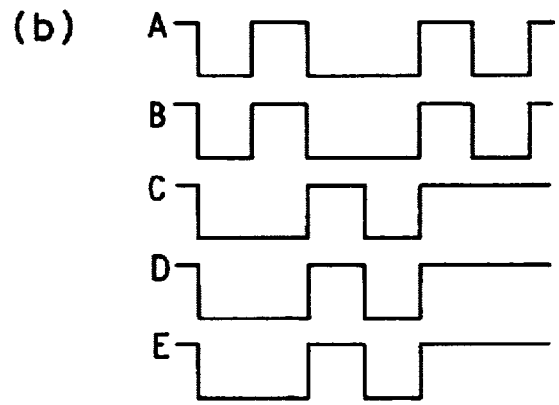

FIG. 2A is an explanatory view showing a situation when the identification code marked by the laser exposure apparatus according to the invention is read by searching scanning lines of a scanning type camera and FIG. 2B displays a search result by the scanning lines in signal levels.

Figure 4:
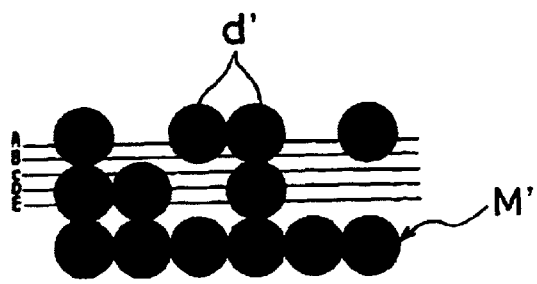
FIG. 4A is an explanatory view showing an identification code formed by a conventional laser exposure apparatus and a situation when the identification code is searched by a scanning type camera and FIG. 4B is an explanatory view showing signal levels provided by searching the identification code by the scanning type camera.
Figure 4:
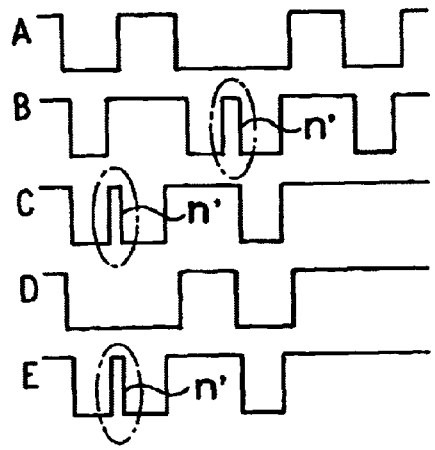

As shown by FIG. 2A, the identification code M marked by the laser exposure apparatus is formed by an aggregation of a number of square dots d, between continuous ones of the square dots d, sides of straight lines are brought into contact with each other and therefore, there is brought about a state in which the square dots d are densely coupled without forming clearances as in the case in which the circular dots d' are brought into contact with each other in FIG. 4A. Therefore, when the scanning lines A through E are made to scan the identification code M by the scanning camera, as shown by FIG. 2B, the noise n' caused in FIG. 4B, is not caused.

Figure 3:
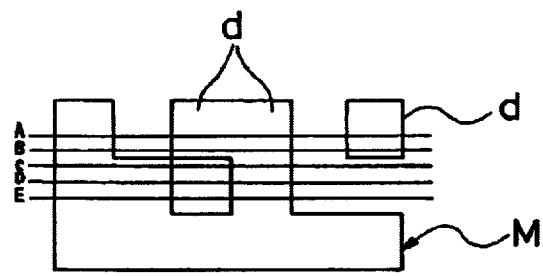
FIG. 3A is an explanatory view showing a situation of searching the identification code by the scanning type camera when a metal film is coated on the identification code formed by the laser exposure apparatus according to the invention and FIG. 3B is an explanatory view showing signal levels provided by searching the identification code by the scanning type camera.
Figure 3:
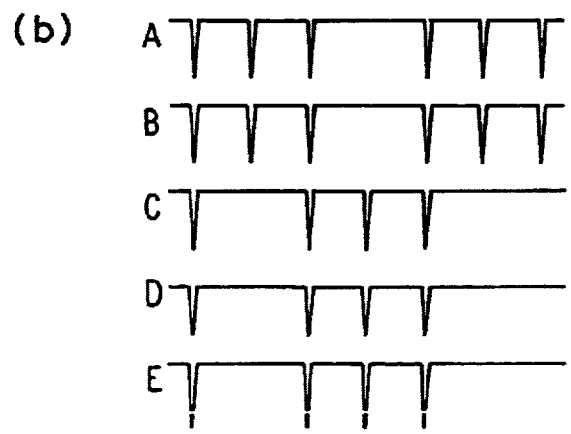
Figure 5:
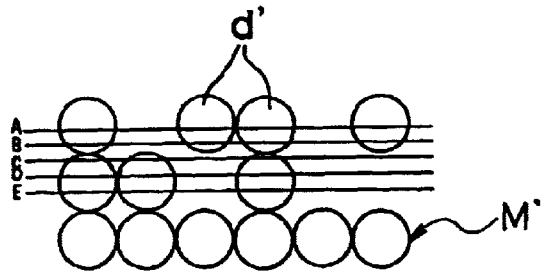
FIG. 5A is an explanatory view showing a situation when the identification is searched by the scanning type camera when a metal film is coated on the identification code formed by the conventional laser exposure apparatus and FIG. 5B is an explanatory view showing signal levels provided by searching the identification code by the scanning type camera.
Figure 5:
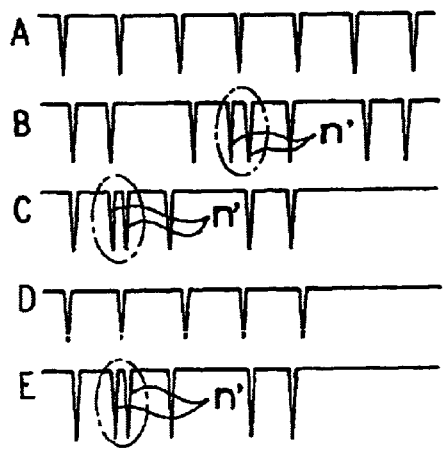

Further, when the wafer is coated with a metal film after making the identification code M, as shown by FIG. 3A, the scanning lines A through E read to catch contours of the circular dots d. Since the sides of the straight lines of the continuous ones of the square dots d are brought into contact with each other, according to signal levels thereof, as shown by FIG. 3B, the noise n' caused in FIG. 5B is not caused.

The identification code (two-dimensional code) provided by the laser exposure apparatus according to the invention is very small and therefore, the identification code can be marked in an extremely narrow area of a wafer and respective chip can be marked and controlled. Further, since the dots for forming the identification code are square, occurrence of noise is inconsiderable, recognizability in recognizing the code is excellent and a rate of reading is promoted in comparison with that of the conventional circular dot.

Further, although in semiconductor fabricating steps, it is anticipated that a number of layers of metal films are provided above the marked identification code, according to the identification code constituted by the square dots, the identification code can be read since an edge thereof can be detected by catching contours of the dots.

INDUSTRIAL APPLICABILITY

The laser exposure apparatus according to the invention is effective as an apparatus of marking an identification code attached on a wafer for carrying out history control or quality control for respective process in semiconductor fabricating steps.

What is claimed is:

1. A laser-powered identification code marking apparatus adapted for marking identification code onto a surface of a workpiece, comprising a laser oscillator for oscillating a laser beam having a circular section, a beam expander for enlarging the laser beam oscillated from the laser oscillator, a square mask for shaping the laser beam having the circular section enlarged by the beam expander into a square section and an optical system for contracting the laser beam formed into the square section by the square mask, wherein the square-section laser beam marking the identification code onto the surface of the workpiece in a form of an aggregation of a plurality of square dots with each two adjacent square dots having two adjacent linear sides being in contact with one another without a gap formed therebetween.

2. The laser-powered identification code marking apparatus according to claim 1, wherein the optical system includes a scanning mechanism.

3. The laser-powered identification code marking apparatus according to claim 2, wherein a shutter mechanism is provided forward from the optical system.

4. The laser-powered identification code marking apparatus according to claim 2 or 3, wherein a lens for correction is arranged rearward from the scanning mechanism in the optical system.

5. The laser-powered identification code marking apparatus according to claim 1, 2 or 3, wherein said optical system is used for exposing an identification code on a wafer in semiconductor fabricating steps.

6. The laser-powered identification code marking apparatus according to claim 4, wherein said optical system is used for exposing an identification code on a wafer en semiconductor fabricating steps.

7. A laser-powered identification code marking apparatus adapted for marking identification code onto a surface of a workpiece, comprising:

a laser oscillator oscillating a laser beam having a circular section, a beam expander enlarging the laser beam oscillated from the laser oscillator, a square mask shaping the laser beam having the circular section enlarged by the beam expander into a square section and an optical system contracting the laser beam formed into the square section by the square mask, wherein the square-section laser beam marking the identification code on the surface of the workpiece in a form of an aggregation of a plurality of square dots with each two adjacent square dots having two adjacent linear sides being in contact with one another without a gap formed therebetween.

* * * * *